(12) United States Patent
Besendörfer et al.

(10) Patent No.: US 9,159,639 B2
(45) Date of Patent: Oct. 13, 2015

(54) POWER ELECTRONIC SYSTEM WITH A COOLING DEVICE

(75) Inventors: Kurt-Georg Besendörfer, Cadolzburg (DE); Nadja Erdner, Leinburg (DE); Jürgen Steger, Hiltpolstein (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 550 days.

(21) Appl. No.: 13/544,630

(22) Filed: Jul. 9, 2012

(65) Prior Publication Data

US 2013/0176682 A1     Jul. 11, 2013

(30) Foreign Application Priority Data

Jul. 7, 2011   (DE) .......................... 10 2011 078 811

(51) Int. Cl.
| | | |
|---|---|---|
| H05K 7/20 | (2006.01) | |
| H01L 23/34 | (2006.01) | |
| H01L 23/18 | (2006.01) | |
| H01L 23/36 | (2006.01) | |
| H01L 23/373 | (2006.01) | |
| H01L 23/498 | (2006.01) | |

(Continued)

(52) U.S. Cl.
CPC ............. *H01L 23/34* (2013.01); *H01L 23/18* (2013.01); *H01L 23/36* (2013.01); *H01L 23/3735* (2013.01); *H01L 23/4985* (2013.01); *H01L 23/49833* (2013.01); *H01L 25/072* (2013.01); *H05K 7/2039* (2013.01); *H01L 24/32* (2013.01); *H01L 24/83* (2013.01); *H01L 2224/32225* (2013.01); *H01L 2224/33181* (2013.01); *H01L 2224/8384* (2013.01); *H01L 2224/83101* (2013.01); *H01L 2924/01068* (2013.01)

(58) Field of Classification Search
USPC .................. 361/676–678, 679.46–679.54, 361/688–722, 760–765, 777–784, 831
See application file for complete search history.

(56) References Cited

U.S. PATENT DOCUMENTS

| | | | |
|---|---|---|---|
| 6,881,071 B2 | 4/2005 | Heilbronner | |
| 2008/0054425 A1* | 3/2008 | Malhan et al. | 257/678 |

(Continued)

FOREIGN PATENT DOCUMENTS

| | | |
|---|---|---|
| DE | 38 37 617 | 5/1990 |
| DE | 197 07 514 A1 | 8/1998 |

(Continued)

*Primary Examiner* — Courtney Smith
(74) *Attorney, Agent, or Firm* — The Law Offices of Roger S. Thompson

(57) ABSTRACT

A power electronic system with a cooling device, and a method for producing the system, comprising a plurality of submodules, each submodule having a first planar insulating material body, one first conductor track cohesively connected thereto, one power switch arranged on the conductor track, at least one internal connecting device composed of an alternate layer sequence of at least one electrically conductive film and at least one electrically insulating film, wherein at least one electrically conductive layer forms at least one second conductor track, and comprising external connection elements. In this case, the submodules are arranged cohesively or in a force-locking manner and in a manner spaced apart from one another with their first main surface on the cooling device. At least one second conductor track at least partially covers first conductor tracks of two submodules, electrically connects them to one another and covers an interspace between the submodules.

8 Claims, 4 Drawing Sheets

(51) Int. Cl.
  *H01L 25/07* (2006.01)
  *H01L 23/00* (2006.01)

(56) References Cited

U.S. PATENT DOCUMENTS

2011/0075451 A1    3/2011  Bayerer
2011/0193105 A1*   8/2011  Lerman et al. .................. 257/88
2015/0069612 A1*   3/2015  Chauhan et al. ............. 257/762

FOREIGN PATENT DOCUMENTS

| DE | 101 21 970        | 11/2002 |
| DE | 10 2004 025 609   | 12/2005 |
| DE | 10 2006 011 995 A1 | 11/2007 |
| DE | 10 2007 006 706   | 8/2008  |
| DE | 10 2009 045 181 A1 | 4/2011  |
| EP | 1 083 599         | 3/2001  |
| WO | WO 9838678        | 9/1998  |

* cited by examiner

POWER ELECTRONIC SYSTEM WITH A COOLING DEVICE

BACKGROUND OF THE INVENTION

1. Field of the Invention

The invention relates to a power electronic system with a cooling device, preferably for forming a circuit arrangement realized therewith in the form of a converter, for example of a three-phase inverter. Such systems are known, for example, as power semiconductor modules having a baseplate or as arrangements of a power semiconductor module without a baseplate comprising a cooling device.

2. Description of the Related Art

German Published Patent Application DE 10 2009 045 181 A1 discloses such a power electronic system, such as discussed here, from a rectifier and an inverter in a common housing. To meet different requirements, the prior system has two substrates, which are in each case formed from an insulating material body with metal laminations on both main surfaces. The respective side of the substrate which faces the interior of the system has a structuring of the metal lamination, which thus forms a plurality of conductor tracks.

A fundamental requirement for all power electronic systems is that the heat resulting from power loss in the power semiconductor components must be dissipated from the system to or via the cooling device. In this case, it should also be taken into consideration that the systems are subjected to cyclic temperature changes during operation. These temperature fluctuations stress the connections of different components of the power electronic system with respect to one another, particularly if these have different coefficients of thermal expansion.

It is therefore an object in the construction of such power electronic systems to compensate for thermally induced mechanical loads and thus to increase the durability, and alternatively or preferably simultaneously, the thermal loading capacity thereof. For this purpose, German Published Patent Application DE 10 2006 011 995 A1 discloses segmenting, in part also completely interrupting, the baseplate of a power semiconductor module in various ways to thereby improve the linking to a further cooling device. German Patent No. DE 197 07 514 A1 additionally proposes, with respect to segmentation, providing the additional baseplate sections with a preliminary bend.

SUMMARY OF THE INVENTION

The object of the invention is to provide an improved power electronic system with a cooling device which improves upon the construction and operation of devices previously known.

It is therefore an object of the invention to provide a power electronic system which thermally connects a power semiconductor component to a cooling device, which connection has better thermal coupling and mechanical durability than devices heretofore known.

One embodiment of the inventive power electronic system comprises a power semiconductor module having a baseplate, wherein the baseplate acts as a first cooling device and can be connected to a further, usually more efficient, second cooling device. In this regard, this corresponds to the widely known construction of a power semiconductor module having external connection elements which are arranged in an electrically insulating housing and form the load and auxiliary connections.

In another embodiment, the inventive power electronic system can include a baseplateless power semiconductor module deployed in conjunction with a cooling device. Such a power semiconductor module likewise has a housing and external connection elements with the abovementioned functionality.

In yet another embodiment, the inventive power electronic system can be a subsystem for constructing a larger unit. In this case, the system preferably does not have its own housing, as is known from the power semiconductor modules mentioned above. The external connection elements serve here either for internal connection within the larger unit or else for the external connection thereof.

In this case, the external connection elements mentioned above can be embodied in various ways, wherein it is possible to provide not just one of these configurations in a power electronic system.

In any embodiment, the inventive power electronic system includes a plurality of first planar insulating material bodies which are arranged cohesively or in a force-locking manner and in a manner spaced apart from one another with their respective first main surface on the cooling device. These insulating material bodies, which are preferably formed of a ceramic material, electrically insulate power switches of the power electronic system from the cooling device thereof.

The first insulating material bodies are in each case part of a submodule furthermore having exactly one first conductor track, which, according to the invention, is arranged on the second main surface of the first insulating material body and is cohesively connected thereto. In this case, the second main surface is arranged opposite the first main surface, as a result of which the respective first conductor tracks are arranged on that side of the assigned first insulating material bodies which faces away from the cooling device.

Furthermore, a submodule has exactly one power switch, which can be configured in various preferred embodiments:

A power switch can be embodied as exactly one power diode or as exactly one power transistor or as exactly one power transistor with an intrinsically embodied power diode reverse-connected in parallel;

A power switch can be embodied as exactly one power transistor with exactly one power diode reverse-connected in parallel; or A power switch can be embodied as at least one power transistor with at least one power diode reverse-connected in parallel, wherein at least three power semiconductor components in this case form this power switch.

By virtue of this embodiment of a submodule comprising exactly one power switch on a dedicated first insulating material body, the power loss generated in the power switch can be dissipated very efficiently towards the cooling device.

Furthermore, the power electronic system according to the invention has at least one internal connecting device composed of an alternate layer sequence of at least one electrically conductive film and at least one electrically insulating film, wherein at least one electrically conductive layer forms at least one second conductor track. In this case, at least one electrically conductive layer of the internal connecting device can be inherently structured and form a plurality of second conductor tracks. Through-plating through insulating layers for electrically connecting conductive layers can likewise be provided.

In accordance with the invention, at least one second conductor track as part of the internal connecting device covers at least one interspace between two submodules. For this purpose, the second conductor track at least partly covers, and makes contact with, the first conductor tracks of the submodules and thus electrically connects these two conductor tracks to one another.

An interspace between the submodules is covered by the second conductor track at least so that the entire distance between the two submodules is covered, but not necessarily over the entire width of one or the other submodule.

To ensure that the second conductor track and the cooling device are electrically insulated from one another, it can be advantageous to fill the interspace between them and the cooling device by an insulating material in such a way that it extends at least in the region of coverage between the edge regions of the first insulating material bodies or of the submodules and respectively adjoins the first insulating material bodies. Of course, for reasons of electrical insulation, it can be advantageous to provide the insulating material not only directly below the second conductor track but also laterally with respect thereto.

In this case, the insulating material can be embodied as a gel-like liquid, such as is used diversely in power semiconductor module, such as, for example, for internal insulation. This configuration offers the advantage of a good connection to the corresponding edge region of the first insulating material body.

Alternatively, the insulating material may also be embodied as a second insulating material body, advantageously formed of a compressible material, which is placed under pressure against the corresponding edge section of the first insulating material body.

A combination of a second insulating material body not necessarily configured as non-compressible material, and gel-like liquid is likewise advantageous as a configuration of the insulating material in specific fields of use.

An advantage provided by the inventive power electronic system lies in the substantial mechanical decoupling of the cooling device and the respective power semiconductor component. The first conductor tracks, since they typically consist of copper, have a coefficient of expansion that is similar or even identical to that of the cooling device, which typically consists of aluminium or copper. By contrast, the first insulating material bodies and the power semiconductor components have a significantly smaller coefficient of expansion. By virtue of the embodiment of the substrate consisting of first conductor tracks and a plurality of first insulating material bodies spaced apart from one another, in the context of thermal expansion, the power semiconductor component from the cooling device are mechanically connected less rigidly than known from the prior art. As a result, the connections of the respective components are mechanically loaded to a lesser extent, resulting in greater durability. At the same time, the thermal coupling of the power semiconductor components of the cooling device is approximately optimal not least on account of the preferred sintering connections.

According to the invention, such a power electronic system is produced by means of the following steps:
a) providing a heat sink;
b) forming submodules from a first planar insulating material body, each submodule having exactly one first conductor track cohesively connected thereto, with exactly one power switch arranged on the first conductor track;
c) connecting the submodules to the cooling device either cohesively or in a force-locking manner, advantageously there now directly follows the arranging of the at least one insulating material;
d) forming the at least one internal connecting device from an alternate layer sequence of electrically conductive and electrically insulating films, wherein at least one electrically conductive layer forms at least one second conductor track;
e) cohesively connecting at least one second conductor track to first conductor tracks of at least two submodules so that at least one second conductor track covers an interspace between the submodules.

Advantageously, these steps are performed either in the given order, or in the order a), b), d), c), e).

As a second embodiment of the inventive method, such a power electronic system is produced by means of the following steps:
a) providing a heat sink;
b) providing first planar insulating material bodies and a respective assigned first conductor track as parts of submodules;
c) cohesively connecting the heat sink to the first insulating material bodies;
d) arranging the power switches on the respective conductor tracks;
e) cohesively connecting the power switches to the assigned conductor track, advantageously there now directly follows the arranging of the at least one insulating material;
f) forming the at least one internal connecting device from an alternate layer sequence of electrically conductive and electrically insulating films, wherein at least one electrically conductive layer forms at least one second conductor track;
g) cohesively connecting at least one second conductor track to first conductor tracks of at least two submodules in such a way that at least one second conductor track covers an interspace between the submodules.

Preferably, the steps are performed in the stated order or steps e) and g) are performed jointly after step f). Independently of this, it is likewise advantageous, during step c), simultaneously to connect the insulating material bodies to the assigned first conductor track.

If the insulating material exclusively consists of a gel-like liquid, the latter can, in both methods, also be arranged at a later point in time in the production process. Specifically, it is known to form such liquids so that they are present in a state of low viscosity and it is only as a result of thermal or other initiation of cross-linking that the viscosity increases and the gel-like state is achieved.

In principle, it is advantageous to form all connections of two connecting partners of the power electronic system, with the exception of that between the heat sink and the first insulating material bodies, as cohesive connections. For the connection between the heat sink and the first insulating material bodies, a force-locking connection is just as suitable as a cohesive connection.

Such a force-locking connection arises in a conventional manner in the art by means of introducing pressure on the first insulating material body. In this case, the pressure can be introduced directly on the insulating material body, via a first conductor track or else via the latter and further components.

As a cohesive connection, various configurations of solder connections are suitable, and also preferably sintering connections owing to their outstanding mechanical and thermal loading capacity, durability and current-carrying capacity. In order to form such sintering connections, it is conventional practice in the art to provide a noble metal surface at the connecting locations of the connecting partners, to arrange a noble-metal-containing sintering paste as connecting means between the two connecting locations, and to connect the connecting partners under high pressure and moderate temperature by means of a pressure sintering apparatus. In the present embodiments of this sintering technology, a plurality of connections, here for example that of the power switches to the first conductor tracks and to an internal connecting device in the form mentioned above, are also formed simultaneously. It can likewise be advantageous, however, to choose other combinations of connecting partners for a simultaneous connection.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
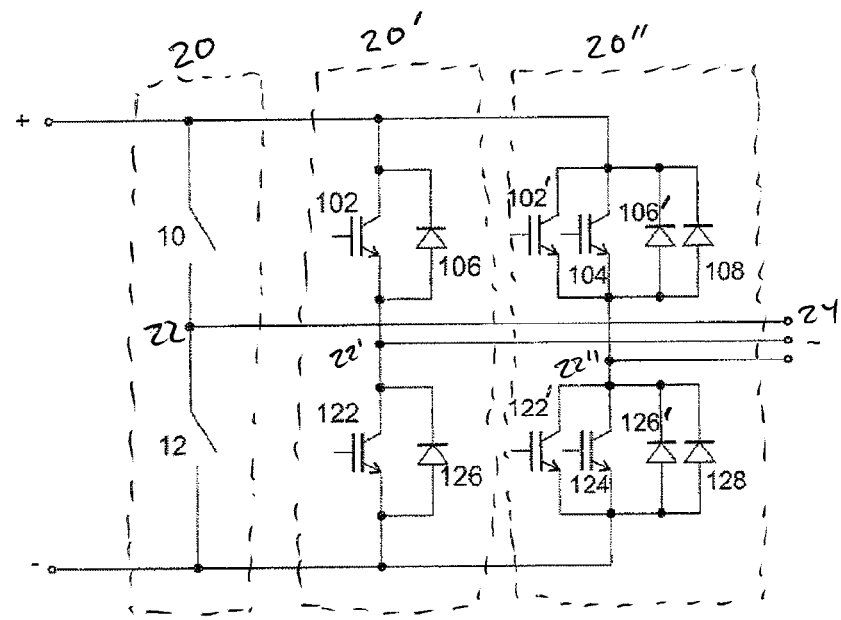
FIG. 1 shows a typical circuit arrangement which can be embodied by one or more power electronic systems according to the invention.

FIG. 1 shows a typical circuit arrangement, a three-phase bridge circuit, which can be embodied by one or more of the inventive power electronic systems. The individual three half-bridges of this three-phase bridge circuit are illustrated here in different degrees of detail.

The first, left half-bridge circuit 20 shows a general illustration, with a first, upper, also called "TOP", power switch 10 and a second, lower, also called "BOT", power switch 12. Power switches 10, 12 are connected to a DC voltage source, while their center tap 22 forms an AC voltage output 24 of the first phase.

Different, more concrete, embodiments are illustrated in the further half-bridge circuits, 20', 20". By way of example, further half-bridge circuit 20' can be embodied as a power transistor 102, 122 with an external or intrinsic power diode 106, 126 reverse-connected in parallel therewith. A plurality of these variants can likewise be provided for forming a power switch. By way of example, two power transistors 102', 104, 122', 124 and two power diodes 106', 108, 126', 128 are provided.

A power electronic system according to the invention can now form at least one, but also all three, of the abovementioned half-bridge circuits simultaneously. In principle, other circuit topologies such as, for example, DC voltage bridges or multilevel bridge circuits having more than two series-connected power switches per bridge circuit may also be formed.

Figure 2:
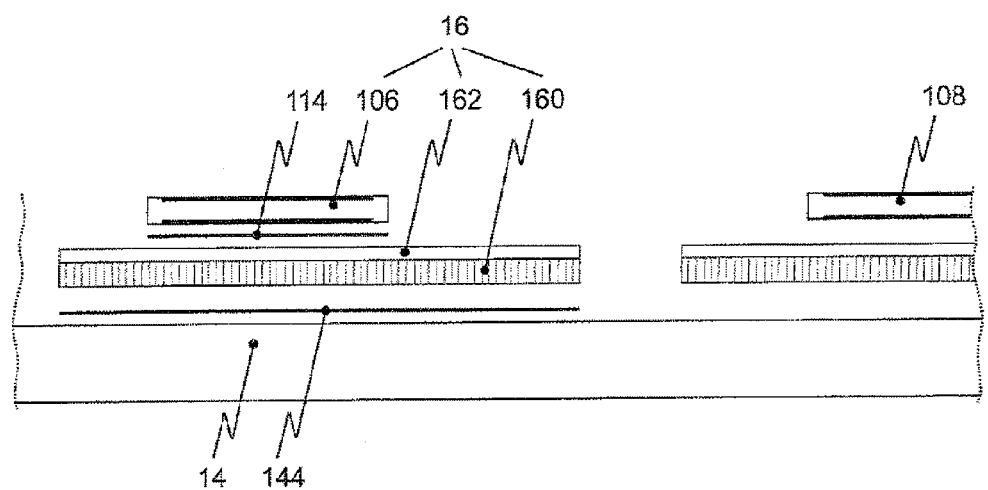
FIGS. 2 to 4 show phases of a first embodiment of the inventive production method.
Figure 3:
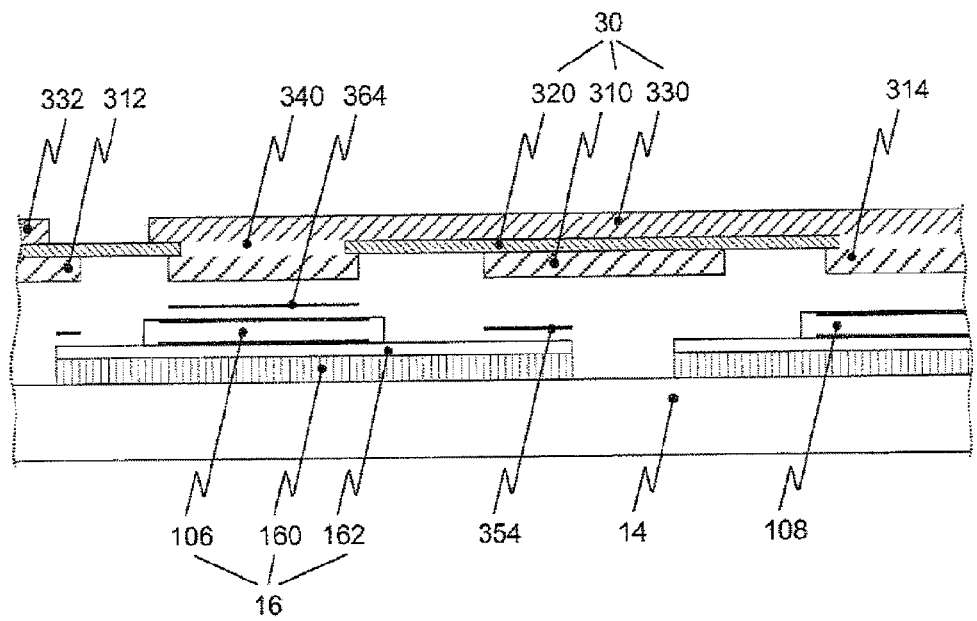
Figure 4:
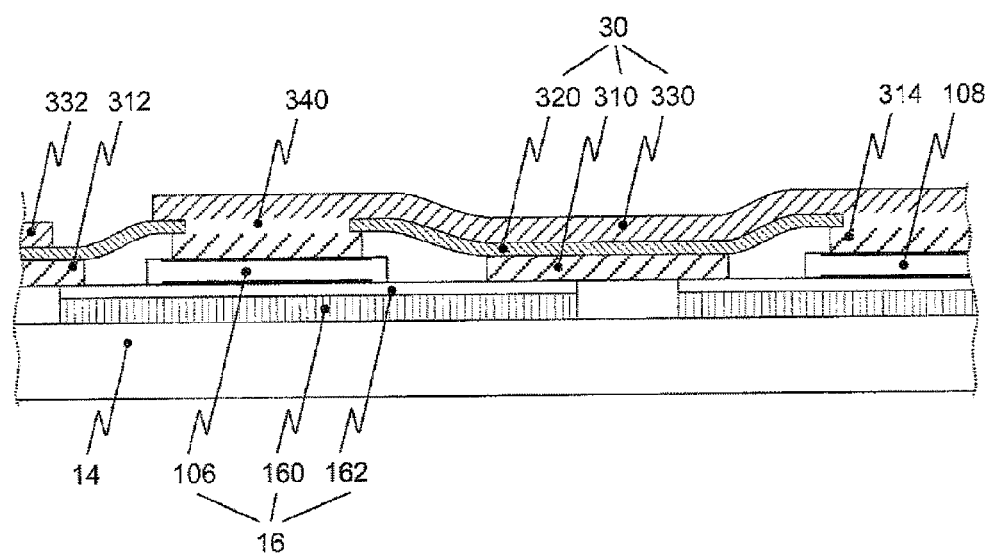

FIGS. 2 to 4 show phases of a first production method according to the invention. FIG. 2 shows schematically in an excerpt a phase of the production of a power electronic system, and two submodules 16. The illustration shows a cooling device 14, two first insulating material bodies 160 each with a first conductor track 162 already arranged thereon. In a manner spaced apart therefrom, power diodes 106 are respectively illustrated as one possible configuration of the inventive power switches shown in FIG. 1. Power diodes 106 are cohesively connected to assigned conductor track 162, for which purpose a connecting layer 114 is provided. The respective power diode 106, more generally the circuits 20, 20' or 20", made up of individual power switches (FIG. 1), and the first insulating material body 160 with first conductor track 162 form submodule 16 and thus the basic element of the inventive power electronic system.

Submodule 16 is cohesively connected to the cooling device 14 by means of a connecting layer 144. It can be advantageous firstly to completely form submodule 16 and then to connect individual submodules 16 to cooling device 14. In this case, individual submodules 16 can already be fed to a first electronic test and only successfully tested submodules 16 are subsequently incorporated further. If the connection of submodules 16 to cooling device 14 should be effected in a force-locking manner, in a way not illustrated, it is expedient, of course, to provide this connection only at a later point in time in the production method.

For reasons of production economy and especially when providing cohesive connections of identical type, it can also be advantageous to cohesively connect the illustrated components in one production step.

FIG. 3 shows an internal connecting device 30, consisting of a layer sequence of an inherently structured conductive film 310, 312, 314, an insulating film 320 and once again an inherently structured conductive film 330, 332. In this case, plated-through holes 340, such as are already known in various configurations from the prior art, are also provided in order to be able to form the circuit-conforming internal connection of the power electronic system. Precisely for this purpose, the individual conductive layers are inherently structured and form the plurality of conductor tracks.

One of these conductor tracks forms a second conductor track 310 for the connection according to the invention of first conductor tracks 162 of submodules 16 to one another. The connection of second conductor tracks 310 of the inherently structured film to first conductor tracks 162 is in this case effected once again by a cohesive connection by means of suitably provided connecting layers 354, only one of which is illustrated. At these contact locations, second conductor track 310 covers first conductor tracks 162. In the manner mentioned, conductive layers 314 of internal connecting device 30 are also connected to contact areas of the power diodes 106, 108, more generally of the power switches of the respective submodules 16. For this purpose, the contact areas are provided on that side of the power diodes 106, 108 which faces away from the first insulating material bodies 160.

FIG. 4 shows an excerpt from this first embodiment of the inventive power electronic system after the arrangement of internal connecting device 30 with respect to submodules 16, wherein here the flexible configuration of the internal connecting device 30 by the alternate layer sequence of two electrically conductive films and an electrically insulating film becomes clear.

Figure 5:
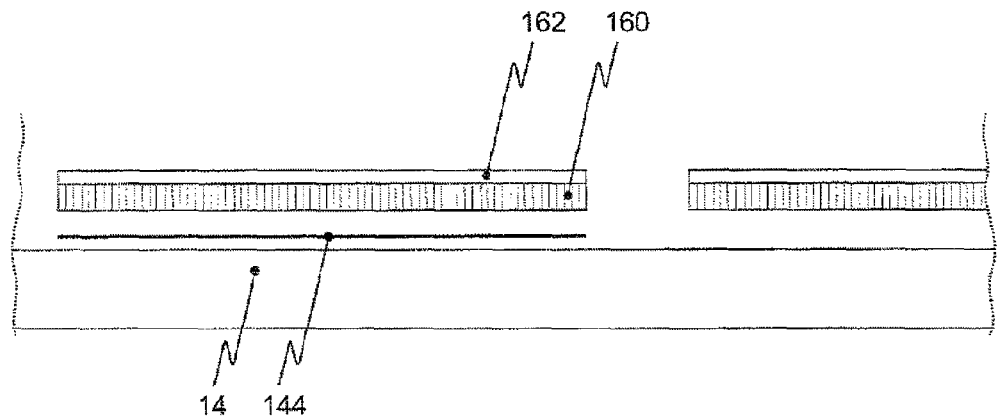
FIGS. 5 to 7 show phases of a second embodiment of the inventive production method.
Figure 6:
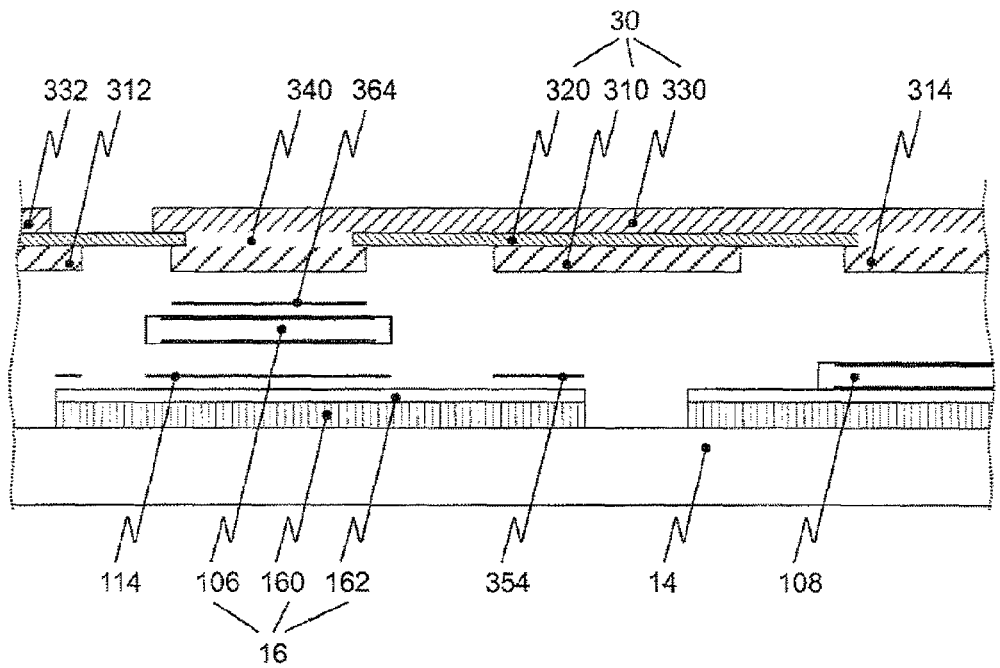
Figure 7:
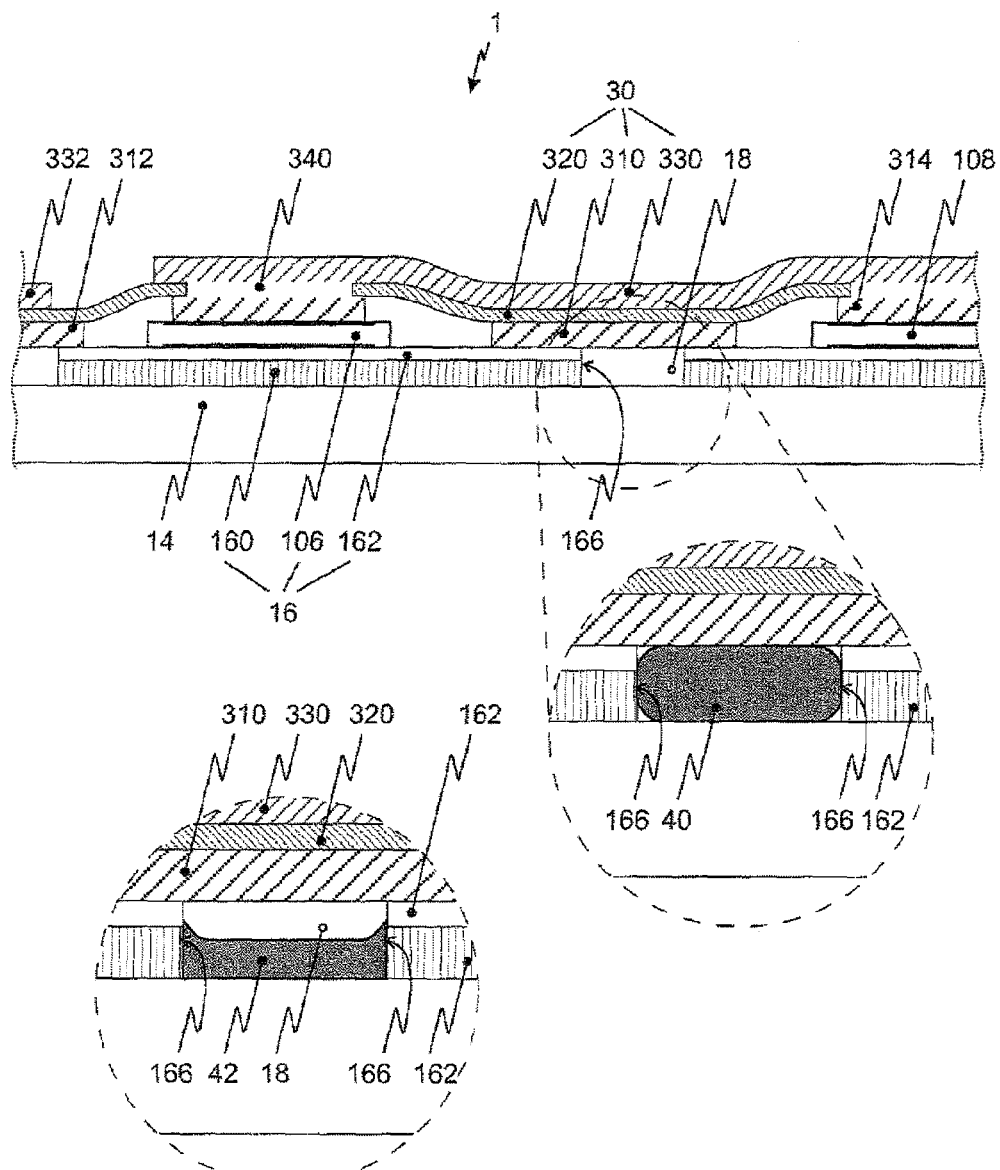

FIGS. 5 to 7 show phases of a second embodiment of the inventive production method. In this case, FIG. 5 shows the connection of cooling device 14 to first insulating material bodies 160 and to first conductor tracks 162. Advantageously, these three components are connected to one another in one production step. Alternatively, it is also possible firstly to connect first conductor tracks 162 to first insulating material bodies 160 and subsequently to connect the latter to cooling device 14.

FIG. 6 shows an internal connecting device 30 already described with regard to FIG. 3. Advantageously, internal connecting device 30 is cohesively connected to power switches 10, 12, illustrated here in the embodiment of power diodes 106, 108, by means of assigned connecting means 364.

In a next step, this composite assembly composed of power diodes 106, 108 and internal connecting device 30 is cohesively connected to the composite assembly composed of cooling device 14, first insulating material bodies 160 and first conductor tracks 162 by means of assigned connecting means 354.

Alternatively, the internal connecting device 30 and the power diodes 106, 108 can be cohesively connected to the composite assembly composed of cooling device 14, first insulating material bodies 160 and first conductor tracks 162 by means of assigned connecting means 354, 364 in one production step.

FIG. 7 shows an excerpt from a power electronic system according to the invention, produced by means of methods mentioned above, comprising a cooling device 14, submodules 16 arranged thereon, and comprising an internal connecting device 30. Second conductor tracks 310 formed by the structuring of a conductive layer of connecting device 30 in this case connect submodules 16, specifically the first conductor tracks 162 thereof, to one another in a circuit-conforming manner. The internal connecting device 30 not only serve for the internal circuit-conforming connection of the power electronic system but can, in its further course (not illustrated), itself form external connection elements or be connected thereto.

Below second conductor tracks 310 and between the edge regions 166 of the submodules 16, an interspace 18 is therefore formed between second conductor track 310 and cooling device 14. An insulating material 40, 42 is provided at necessary locations in interspace 18, the insulating material being embodied here in the excerpt enlargements, either as a gel-like liquid 42 or as a second compressible insulating material body 40. It goes without saying that both configurations can also be provided in combination.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power electronic system with a cooling device, the system comprising:

a plurality of submodules, each of said submodules having a first planar insulating material body, a single first conductor track cohesively connected thereto, a single power switch arranged on said first conductor track, at least one internal connecting device composed of an alternating layer sequence of at least three layers, said at least three layers including at least one electrically conductive film and at least one electrically insulating film;

wherein at least one electrically conductive layer forms at least one second conductor track, and includes external connection elements;

wherein said submodules are arranged in one of a cohesively and a force-locking manner, and are spaced apart from one another with their first main surface in thermal contact with the cooling device; and wherein said at least one second conductor track at least partially covers first conductor tracks of two submodules, electrically connects them to one another and covers an interspace between said two submodules.

2. The power electronic system of claim 1, wherein
at least one of said single power switches is embodied as one of the group consisting of:
a single power diode;
a single power transistor; and
a single power transistor with an intrinsically embodied power diode reverse-connected in parallel.

3. The power electronic system of claim 1, wherein
at least one of said single power switches is embodied as a single power transistor with a single power diode reverse-connected in parallel.

4. The power electronic system of claim 1, wherein
at least one of said single power switches is embodied as a single power transistor with at least one power diode reverse-connected in parallel.

5. The power electronic system of claim 1, wherein
said first insulating material bodies are formed of a ceramic material.

6. The power electronic system of claim 1, wherein
at least one electrically conductive layer of the internal connecting device is inherently structured and forms a plurality of second conductor tracks.

7. The power electronic system of claim 1, further comprising:
an interspace between two of said plurality of submodules; and wherein
said interspace is covered by a second conductor track, and is filled by an insulating material so that it extends at least in the region of coverage between edge regions of said two of said plurality of submodules.

8. The power electronic system of claim 7, wherein
said insulating material is formed as at least one of a second insulating material body and a gel-like liquid.

* * * * *